United States Patent
Arsenijevic et al.

(10) Patent No.: US 9,780,525 B2
(45) Date of Patent: Oct. 3, 2017

(54) OPTOELECTRONIC OSCILLATOR

(71) Applicant: Technische Universität Berlin, Berlin (DE)

(72) Inventors: Dejan Arsenijevic, Berlin (DE); Moritz Kleinert, Berlin (DE); Dieter Bimberg, I, Berlin (DE)

(73) Assignee: Technische Universität Berlin, Berlin (DE)

( * ) Notice: Subject to any disclaimer, the term of this patent is extended or adjusted under 35 U.S.C. 154(b) by 5 days.

(21) Appl. No.: 14/900,081

(22) PCT Filed: Jun. 12, 2014

(86) PCT No.: PCT/DE2014/200257
§ 371 (c)(1),
(2) Date: Dec. 18, 2015

(87) PCT Pub. No.: WO2014/202074
PCT Pub. Date: Dec. 24, 2014

(65) Prior Publication Data
US 2016/0149377 A1    May 26, 2016

(30) Foreign Application Priority Data
Jun. 20, 2013 (DE) .................... 10 2013 211 633

(51) Int. Cl.
*H01S 3/098* (2006.01)
*H01S 5/065* (2006.01)
(Continued)

(52) U.S. Cl.
CPC .............. *H01S 5/0657* (2013.01); *H01S 3/11* (2013.01); *H01S 3/1112* (2013.01);
(Continued)

(58) Field of Classification Search
CPC .. H01S 5/0657; H01S 5/06817; H01S 5/0428; H01S 3/11; H01S 5/06253;
(Continued)

(56) References Cited

U.S. PATENT DOCUMENTS 7,164,699 B1 * 1/2007 Braun ..................... H01S 5/065
372/29.022
7,492,795 B1 * 2/2009 Delfyett ................ H01S 3/1109
372/18

FOREIGN PATENT DOCUMENTS

JP    2007-251365 A    9/2007

OTHER PUBLICATIONS

English Translation of JP2007-251365.*
(Continued)

*Primary Examiner* — Yuanda Zhang
(74) *Attorney, Agent, or Firm* — Gordon & Rees LLP

(57) ABSTRACT

An optoelectronic oscillator for generating an optical and/or electric pulse comb, comprising a monolithically integrated passively mode-coupled semiconductor laser and an optical feedback loop which guides a part of the optical radiation of the semiconductor laser and feeds said part back into the semiconductor laser as feedback pulses. Without the influence of the feedback pulses, the semiconductor laser would emit comb-like optical pulses, hereafter referred to as primary pulses, and in the event of an influence, emits comb-like output pulses which have been influenced by the feedback pulses, said output pulses having a lower temporal jitter or less phase noise than the primary pulses. The feedback loop is damped between 27.5 and 37.5 dB, and the time lag of the feedback loop is selected such that each feedback pulse is incident within the temporal half-value width of each subsequent primary pulse.

10 Claims, 12 Drawing Sheets

Figure 1:
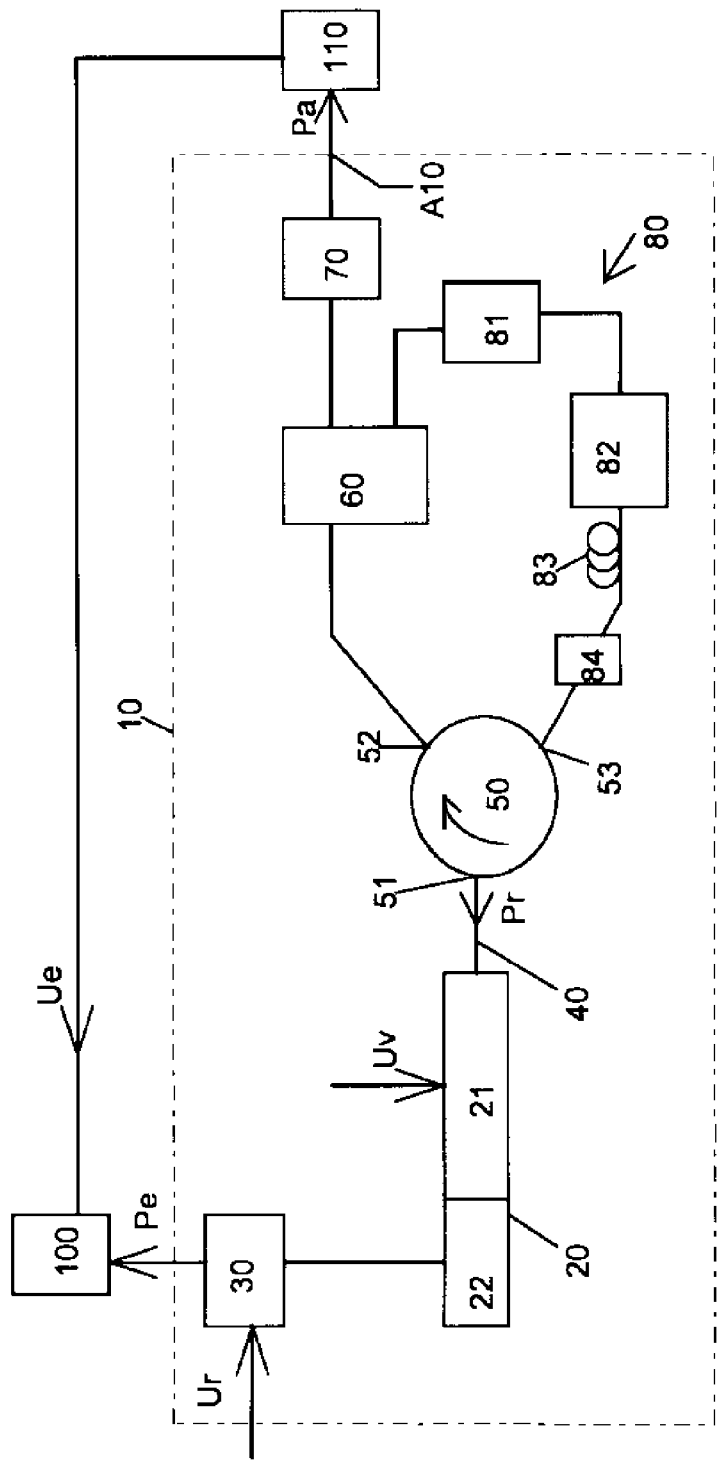

(51) Int. Cl.
    *H01S 3/11*    (2006.01)
    *H01S 5/062*   (2006.01)
    *H01S 5/0625*  (2006.01)
    *H01S 5/042*   (2006.01)
    *H01S 5/068*   (2006.01)
    *H03K 3/42*    (2006.01)

(52) U.S. Cl.
    CPC .......... *H01S 3/1115* (2013.01); *H01S 5/0428* (2013.01); *H01S 5/0656* (2013.01); *H01S 5/06223* (2013.01); *H01S 5/06253* (2013.01); *H01S 5/06817* (2013.01); *H03K 3/42* (2013.01)

(58) Field of Classification Search
    CPC .. H01S 5/06223; H01S 3/1112; H01S 3/1115; H01S 5/0656; H03K 3/42
    See application file for complete search history.

(56) References Cited

OTHER PUBLICATIONS

G. Fiol et al. "1.3 um range 40 GHz quantum-dot mode-locked laser under external continuous wave light injection or optical feedback", Semiconductor Science and Technology, IOP Publishing LTD, GB, vol. 26, No. 1, pp. 1-5, Nov. 15, 2010 (with emphasis on the underlined portions).*
International Search Report mailed Jan. 10, 2014 issued in PCT/DE2014/200257.
L. Maleki, "The Optoelectronic Oscillator"; Industry Perspective—Technology Focus; Nature Photonics; vol. 5; pp. 728-730; Dec. 2011.
S. K. Tewksbury et al.; "Optical Clock Distribution in Electronic Systems"; Journal of VLSI Signal Processing; vol. 16; pp. 225-246; 1997.
P. J. Delfyett et al; "Optical Clock Distribution Using a Mode-Locked Semiconductor Laser Diode System," Journal of Lightwave Technology; vol. 9; No. 12; pp. 1646-1649; Dec. 1991.
H. A. Haus; "Mode-Locking of Lasers"; IEEE Journal on Selected Topics in Quantum Electronics; vol. 6; No. 6; pp. 1173-1185; Nov./Dec. 2000.
D. Bimberg; "Quantum dot based nanophotonics and nanoelectronics"; Electronics Letters; vol. 44; No. 3; Jan. 31, 2008.
M. Kuntz et al.; "High-Speed Mode-Locked Quantum-Dot Lasers and Optical Amplifiers"; Proceedings of the IEEE; vol. 95; No. 9; pp. 1767-1778; Sep. 2007.
J. Lasri et al.; "A Self-Starting Hybrid Optoelectronic Oscillator Generating Ultra Low Jitter 10-GHz Optical Pulses and Low Phase Noise Electrical Signals"; IEEE Photonics Technology Letters, vol. 14, No. 7; pp. 104-106; Jul. 2002.
C.W. Nelson et al.; "Microwave Optoelectronic Oscillator with Optical Gain"; National Institute of Standards & Technology (NIST); Boulder, CO USA; 2007.
N. Yu et al.; "Ultralow-noise mode-locked laser with coupled optoelectronic oscillator configuration"; Optical Society of America; Optics Letters; vol. 30; No. 10; pp. 1231-1233; May 15, 2005.
G. Fiol et al.; "1.3 µm range 40 GHz quantum-dot mode-locked laser under external continuous wave light injection or optical feedback"; Semiconductor Science and Technology; IOP Publishing LTD, GB; vol. 26; No. 1; pp. 1-5; Nov. 15, 2010.
F. Kéfélian et al., "RF Linewidth in Monolithic Passively Mode-Locked Semiconductor Laser"; IEEE Photonics Technology Letters; vol. 20; No. 16; pp. 1405-1407; Aug. 15, 2008.
D. Von Der Linde; "Characterization of the Noise in Continuously Operating Mode-Locked Lasers"; Applied Physics B; vol. 39; pp. 201-207; 1986.
G. Fiol; "1.3 µm Monolithic Mode-Locked Quantum-Dot Semiconductor Lasers"; Berlin: Mensch und Buch Verlag; 2011.
OEwaves, Inc.; "Micro-Opto-Electronic Oscillator (uOEO)"; Preliminary Product Brief; Pasadena, CA USA.
C. Lin et al.; "Microwave Characterization and Stabilization of Timing Jitter in a Quantum-Dot Passively Mode-Locked Laser via External Optical Feedback"; IEEE Journal of Selected Topics in Quantum Electronics; vol. 17; No. 5; pp. 1311-1317; Sep./Oct. 2011.
S. Breuer et al.; "Investigations of Repetition Rate Stability of a Mode-Locked Quantum Dot Semiconductor Laser in an Auxiliary Optical Fiber Cavity"; IEEE Journal of Quantum Electronics; vol. 46, No. 2; pp. 150-157; Feb. 2010.
C. Otto; et al.; "Delay-induced dynamics and jitter reduction of passively mode-locked semiconductor lasers subject to optical feedback"; New Journal of Physics; Institute of Physics Publishing, Bristol, GB; The Open Access Journal of Physics; vol. 14; No. 11; Nov. 22, 2012.
D. Bimberg, et al.; "Nanophotonics for Datacom and Telecom Applications"; Proceedings of SPIE; S P I E—International Society for Optical Engineering, US; vol. 8265 82650E-1; Jan. 25, 2012.
D. Arsenijevic, et al.; "Phase noise and jitter reduction by optical feedback on passively mode-locked quantum-dot lasers"; Applied Physics Letters; American Institute of Physics US; vol. 103; No. 23; Dec. 2, 2013.

* cited by examiner

OPTOELECTRONIC OSCILLATOR

The invention relates to an optoelectronic oscillator for producing an optical and/or electrical pulse comb, comprising a monolithically integrated passive mode-locked semiconductor laser and comprising an optical feedback loop which guides part of the optical radiation from the semiconductor laser and couples said radiation back into the semiconductor laser as feedback pulses, wherein the semiconductor laser would emit comb-like optical pulses— referred to as primary pulses below—without influence by the feedback pulses and emits influenced, comb-like output pulses in the case of influence by the feedback pulses, which output pulses have a smaller temporal jitter or a smaller phase noise than the primary pulses.

Such an oscillator for primary pulses is known from document [10]. It is possible to achieve comb-like optical output pulses with jitter values in the picosecond range using this previously known oscillator.

Electrical signals with frequencies in the range between 10 GHz and 100 GHz increasingly find use in wireless communication, in high-resolution, short-range radar installations and as a clock for components in optical communication networks. The stability of the frequency domain, in addition to the power of such an electrical signal, is of utmost importance for the practical application [1].

Particularly the use as a clock for optical data communication presents new challenges here, since the clock frequency of the electrical signal must correspond exactly with the bit rate of the optical signal. Moreover, a trend toward stronger optical integration can be observed, and so an optical clock signal with the same frequency is required in addition to the electrical signal [2].

A monolithically integrated mode-locked semiconductor laser lends itself as a source for an optical clock signal due to small dimensions (area of the chip approximately 0.3 mm$^2$), thermal and physical stability and low costs thereof. Said semiconductor laser consists of a laser diode, the waveguide of which is subdivided into two electrically separated portions. These are the gain section and absorber section [3]. A forward voltage is applied to the part of the mode-locked laser (denoted MLL below) forming the gain section such that a constant current flows across the diode. As a result of this, there is a net gain above the laser threshold in this part of the laser diode and laser light is generated. In the region of the absorber section, the diode is switched into the reverse direction, i.e. a negative voltage $U_r$ is applied. The photons generated in the gain section which are absorbed in this absorber section excite an electron-hole pair. Since fewer states are available for further absorption processes for a brief period of time as a result thereof, the absorption probability reduces. Thus, the absorber is saturatable by way of photon absorption and becomes transparent in the case of a suitably strong excitation. The excited electron-hole pairs are now separated by the applied reverse voltage. As a result, these states are available again for further absorption processes after a certain amount of time— the recovery period of the absorber. Provided that it is modulated, the photocurrent generated by the separated electron-hole pairs leads to a modulation in the electrical resistance in the absorber section [4], [5].

The coupling of the gain in the gain section with the saturatable absorption leads to the formation of pulses in the cavity by way of the process of mode locking. In the case of fundamental mode locking, a single pulse propagates in the cavity after the settling time. As a result, the repetition rate $f_{MLL}$ is given directly by the length of the laser diode:

$$f_{MLL} = \frac{v_{Gr}}{c} = \frac{c}{n - \lambda \frac{\partial n}{\partial \lambda}} \frac{1}{L}$$

where L denotes the length of the MLL cavity, n denotes the refractive index in the MLL cavity, $V_{Gr}$ denotes the group velocity in the MLL cavity, $\lambda$ denotes the wavelength and c denotes the phase velocity of light in vacuo.

If—as described above—a constant voltage is applied to the absorber section, this is referred to as passive mode locking. The advantage of this mode of operation lies in the fact that there is no need to provide an external electrical radiofrequency signal. This renders it possible to realize such an operation at low costs. However, there is limited usability of the pulse trains generated thus as an optical clock signal since the stochastic nature of the spontaneous emission leads to large variations in the pulse spacing and pulse amplitude.

This disadvantage is usually compensated for by so-called hybrid mode locking. Here, a stabilizing external radiofrequency voltage signal is applied in addition to the constant voltage across the absorber. As a result of this reference frequency, it is possible to decisively reduce the phase noise of the emitted pulse train in the case of sufficiently high powers of the external signal. However, since the frequency of the external signal must lie close (distance of at most a few MHz) to the repetition rate $f_{MLL}$ of the pulse train emitted by the MLL, a radiofrequency and low-noise electrical signal is in turn indispensable herefor [6]. Since the impedance of a laser diode typically does not correspond to the impedance of electrical radiofrequency systems (50Ω), the electric power of the radiofrequency signal must moreover be high (≥14 dBm), increasing the costs for such an operation.

Currently, the simultaneous provision of low-noise optical and electrical signals in the GHz range is realized by optoelectronic oscillators, which consist of a continuous wave laser, a modulator, a photodiode, an electrical filter and one or more electrical amplifiers. In this design, the feedback is not optical—as will be shown below—but rather brought about by an electrical signal at the modulator. However, the disadvantage in relation to the component presented here is that active components are required for electrical feedback. Particularly the use of a modulator, which requires high input powers of the electrical signal and which can consequently only be ensured with the aid of electrical amplifiers, is detrimental in view of the cost efficiency. As a result of the use of active electronic components, the maximum repetition rate is restricted and the production costs are high [7], [8], [9].

Proceeding from the prior art sketched out above, in particular proceeding from document [10], the invention is based on the object of specifying an oscillator which allows the production of output pulses with a particularly low jitter.

According to the invention, this object is achieved by an oscillator having the features in accordance with patent claim 1. Advantageous refinements of the oscillator according to the invention are specified in the dependent claims.

According thereto, the invention provides for the damping of the feedback loop to be between 27.5 and 37.5 dB and for the time lag of the feedback loop to be selected in such a way that each feedback pulse is incident within the temporal full width at half maximum of the respective next primary pulse, i.e. of that next pulse which the semiconductor laser would have produced without influence by the incident feedback pulse.

A significant advantage of the oscillator according to the invention can be considered to be that of being able, with the latter, to achieve values for the integrated jitter in the region of 219 femtoseconds, or less, due to the parameter range provided according to the invention in respect of the damping of the feedback loop and of the time lag between the feedback pulses and primary pulses, i.e. jitter values that are smaller by a factor of 5 compared to the best previously known oscillators (cf. a jitter value of 1 picosecond in the oscillator as per [10]).

Preferably, the time lag of the feedback loop is selected in such a way that the pulse peak power of each feedback pulse is incident within the temporal full width at half maximum of the respective next primary pulse.

The active region of the semiconductor laser preferably has a double heterostructure or a fivefold structure with separated localization of charge carriers and photons, with quantum wells, quantum wires and/or quantum dots.

The active region is preferably embedded in a pn-laser structure consisting of p-doped and n-doped sheath layers and highly doped contact layers.

The semiconductor laser is preferably radiofrequency-capable due to planarizing and insulating BCB (benzocyclobutene), SiN (silicon nitride) or SOG (spin on glass) intermediate layers and a multiple layer metalization.

It is advantageous if the contacting of the absorber section of the semiconductor laser and the extraction of the electrical pulses of the semiconductor laser is radiofrequency-capable due to radiofrequency pickups in the form of a scanning head and bond wires, a radiofrequency bias tee and/or due to radiofrequency lines which are e.g. planar.

The impedance of the semiconductor laser is preferably matched to the impedance of signal pickups.

The facet of the absorber section is preferably highly reflective.

Guiding light in the optical feedback loop is preferably based on free-beam optics and/or optical waveguides (e.g. glass fibers).

The feedback loop preferably reflects a constant or variable portion of the radiation from the semiconductor laser.

The length of the feedback loop can be constant or variable.

The optical feedback preferably leads to noise suppression in the optical and/or electrical signal.

It is also advantageous if pulses circulating in a cavity of the semiconductor laser lead to modulation of the photocurrent at the absorber section.

The modulated photocurrent is preferably accessible to measurements by way of radiofrequency-capable contacting of the absorber section.

Preferably, the noise suppression by way of the optical feedback is transferred to a corresponding noise suppression of the modulation of the electrical signal.

Preferably, both electrical and optical pulses are output on the output side. Alternatively, only optical pulses or only electrical pulses can be output on the output side.

In order to generate an electrical pulse comb on the output side, it is considered to be advantageous if a bias tee is electrically connected to the monolithically integrated mode-locked semiconductor laser, by means of which electrical pulses which, in terms of their frequency, correspond to the optical output pulses of the semiconductor laser influenced by the feedback pulses, are decoupled.

It is particularly advantageous if the semiconductor laser comprises a gain section, to which a forward voltage can be applied, and an absorber section, to which a reverse voltage can be applied, and if the bias tee is electrically connected to the absorber section.

Preferably, the reverse voltage and the modulated photocurrent from the absorber section are applied to the bias tee.

It is considered to be particularly advantageous if one connection of the bias tee forms an electrical output for outputting electrical pulses, the pulse profile of which corresponds to, or is identical to, the pulse profile of the optical pulses of the semiconductor laser influenced by the feedback pulses of the feedback loop.

The repetition frequency can preferably be set within a few MHz as a result of the relative delay. Preferably, the length of the feedback loop lies between 30 m and 34 m and/or it is selected in such a way that 6000 to 7000 optical pulses circulate therein.

The invention moreover relates to a method for generating an optical and/or electrical pulse comb by means of an optoelectronic oscillator comprising a monolithically integrated mode-locked semiconductor laser and an optical feedback loop which reflects part of the optical radiation from the semiconductor laser and couples said radiation back into the semiconductor laser as feedback pulses, wherein the semiconductor laser would emit comb-like optical pulses—referred to as primary pulses below—without influence by the feedback pulses and emits influenced, comb-like pulses in the case of influence by the feedback pulses from the feedback loop.

According to the invention, provision is made in this respect for the damping of the feedback loop to be set to a value between 27.5 and 37.5 dB and for the time lag of the feedback loop to be set in such a way that each feedback pulse is incident within the temporal full width at half maximum of the respective next primary pulse, i.e. of that next pulse which the semiconductor laser would have produced without influence by the incident feedback pulse.

In respect of the advantages of the method according to the invention, reference is made to the above explanations in the context of the oscillator according to the invention.

Figure 2:
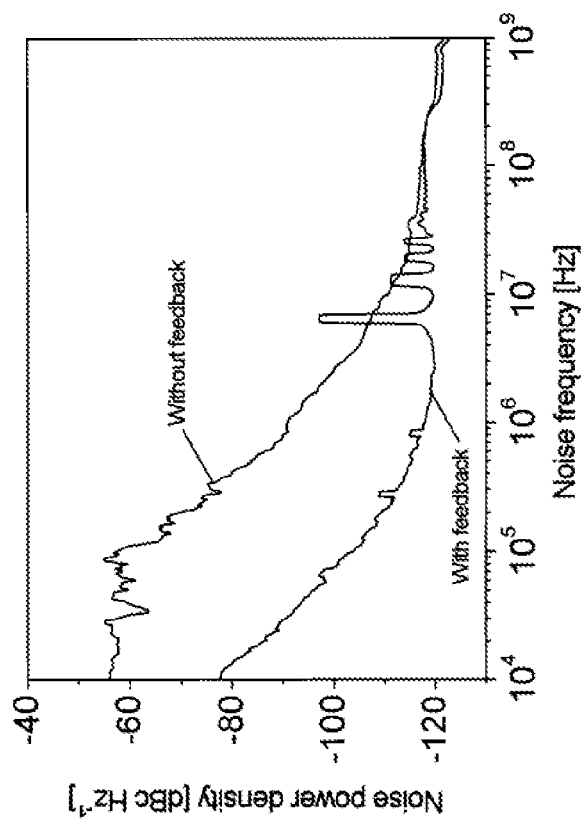
Figure 2:
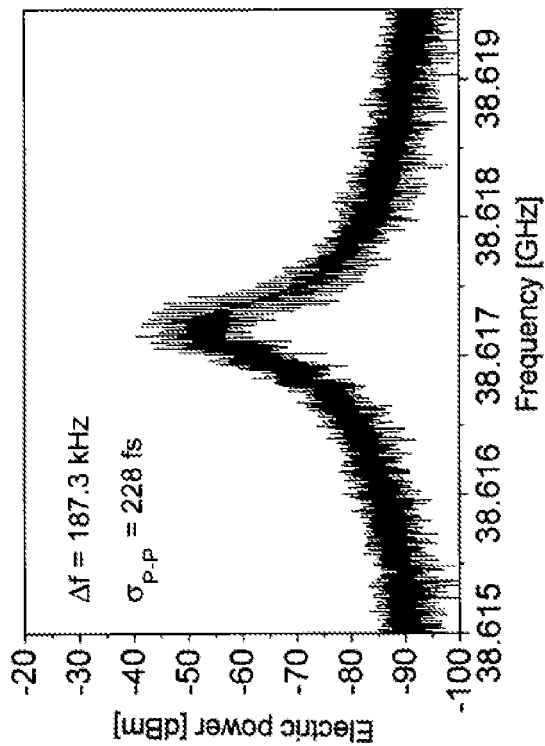
Figure 2:
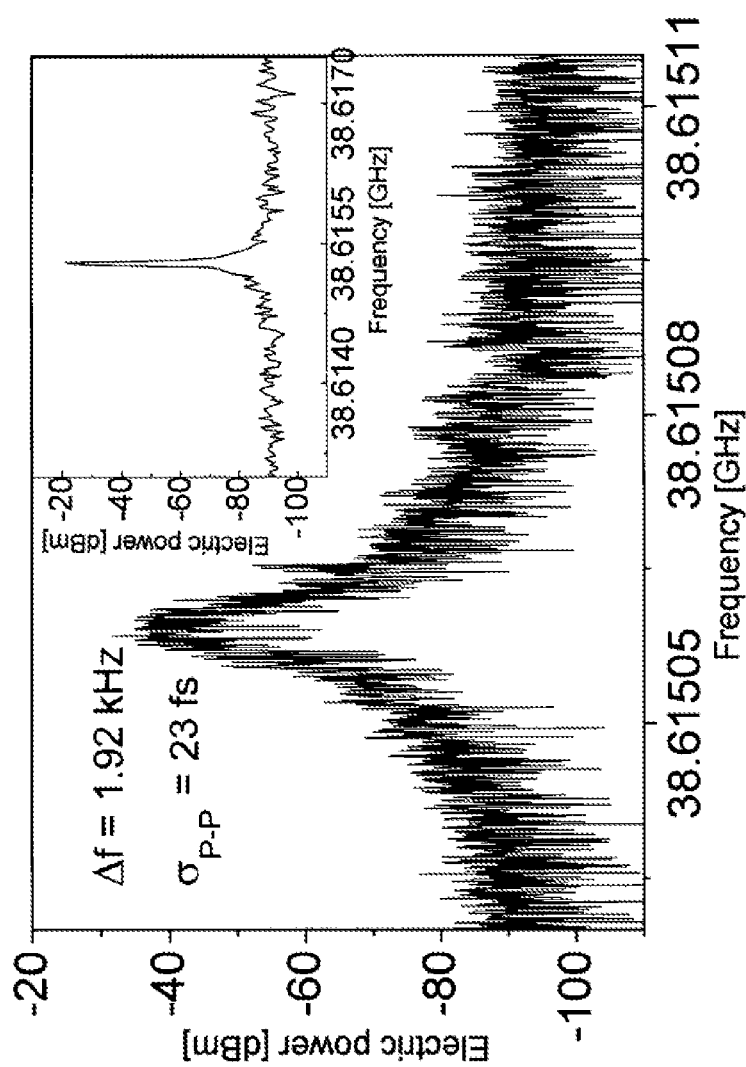
Figure 3:
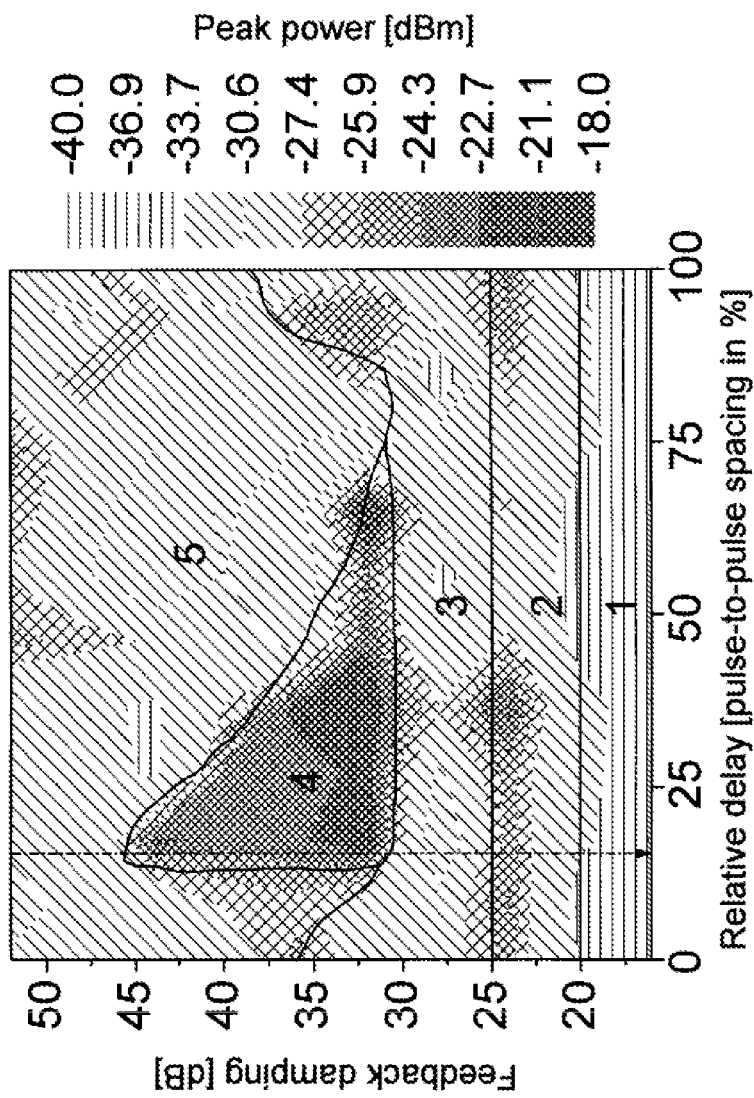
Figure 4:
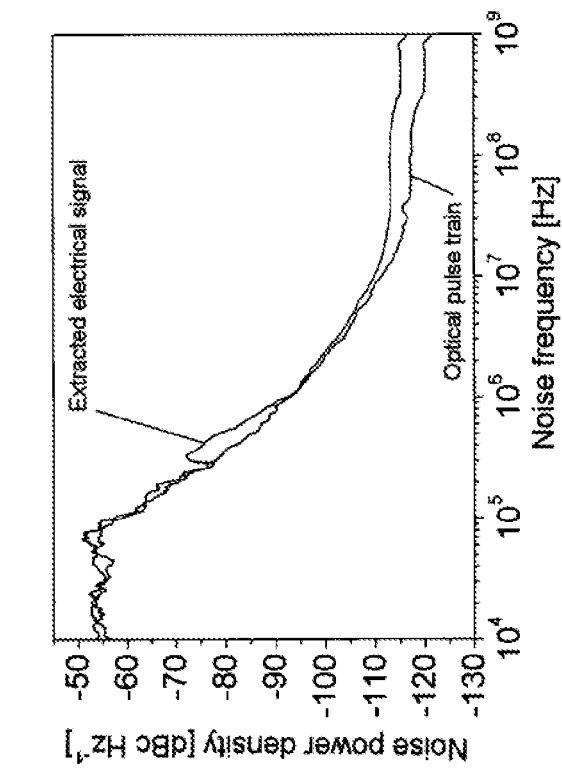
Figure 4:
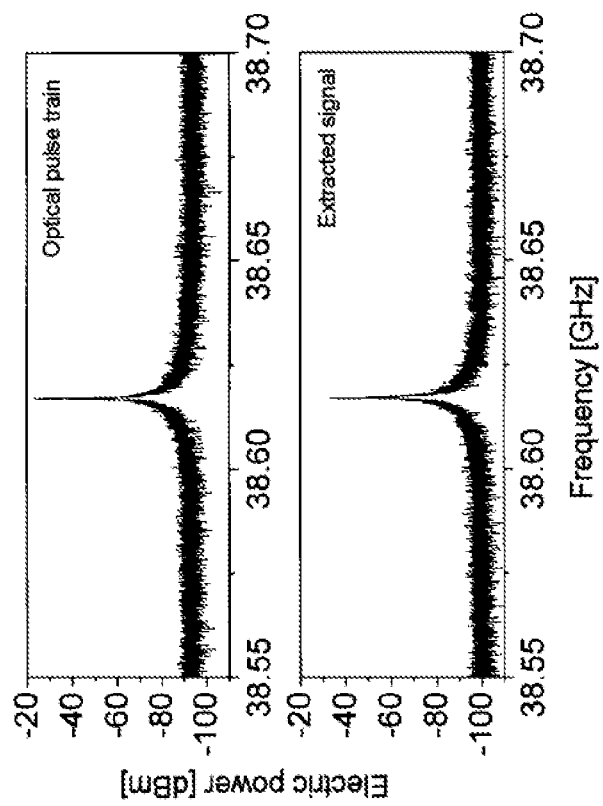
Figure 5:
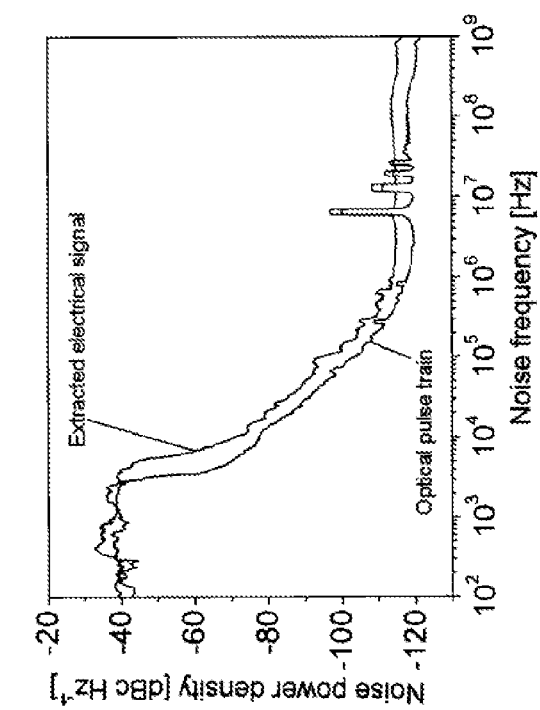
Figure 5:
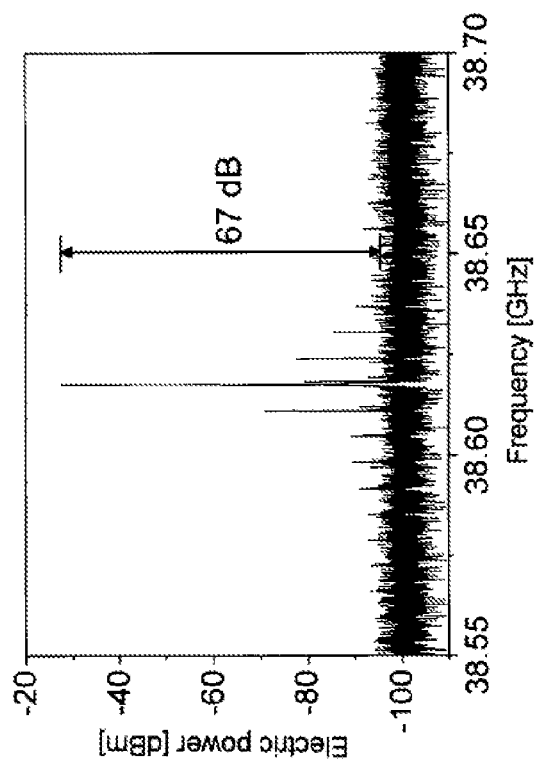
Figure 5:
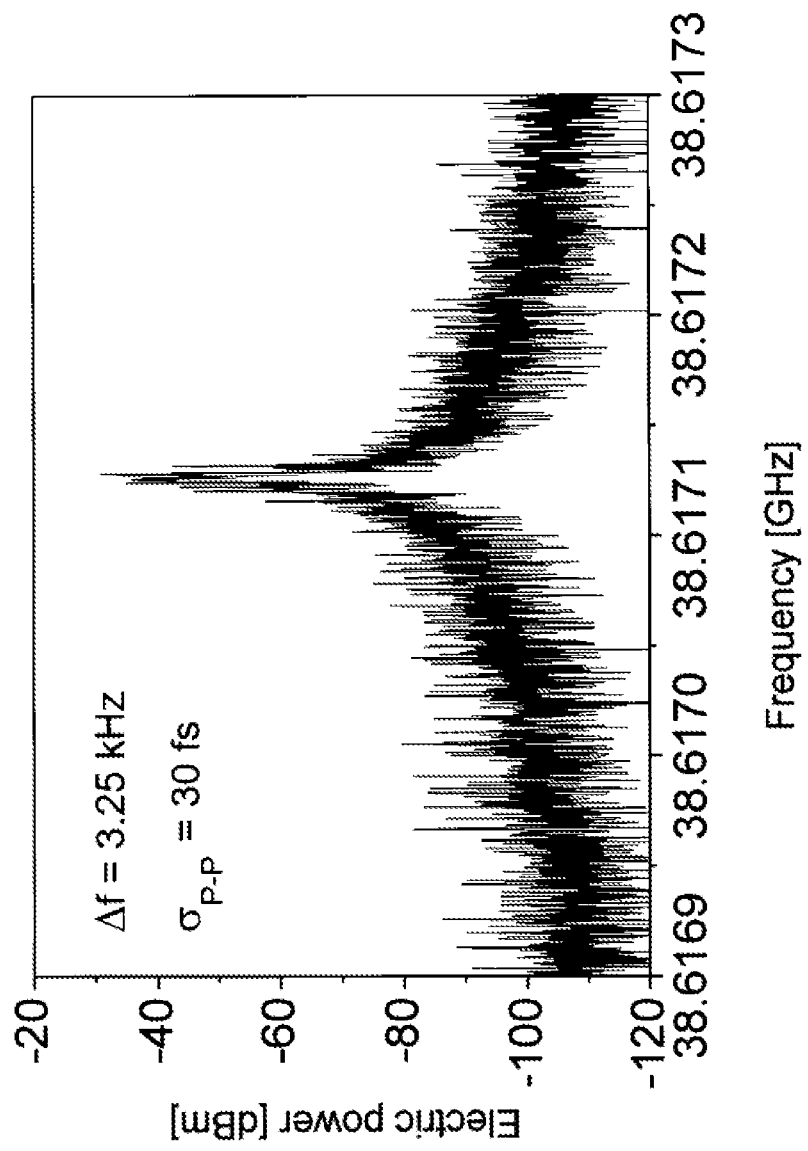
Figure 6:
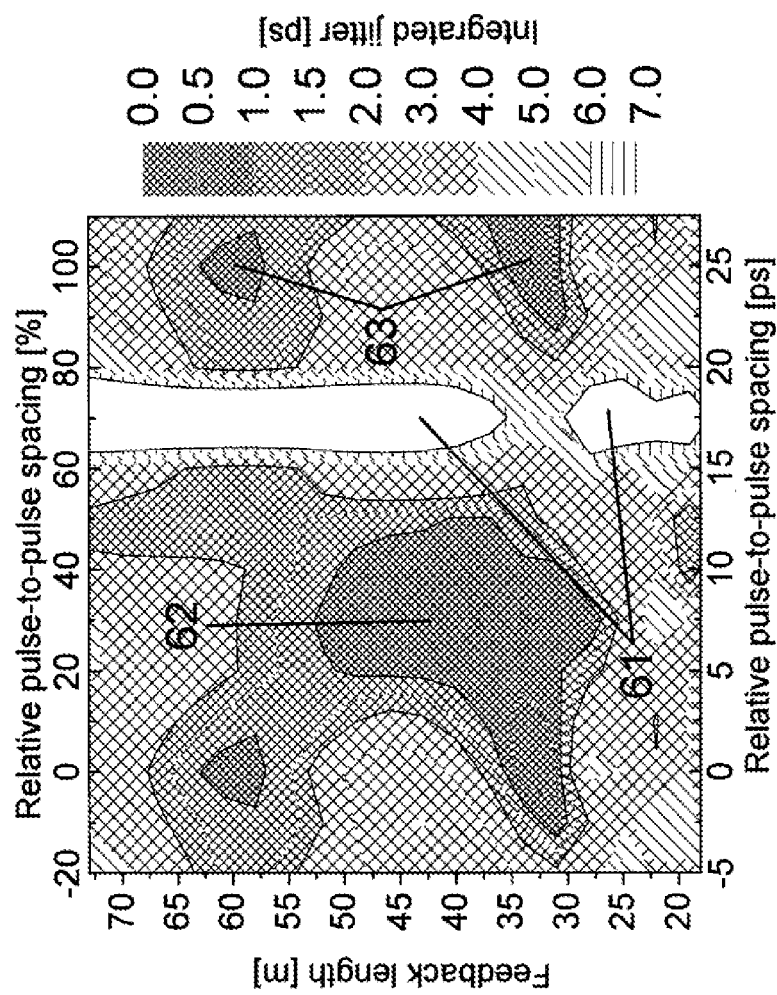
Figure 7:
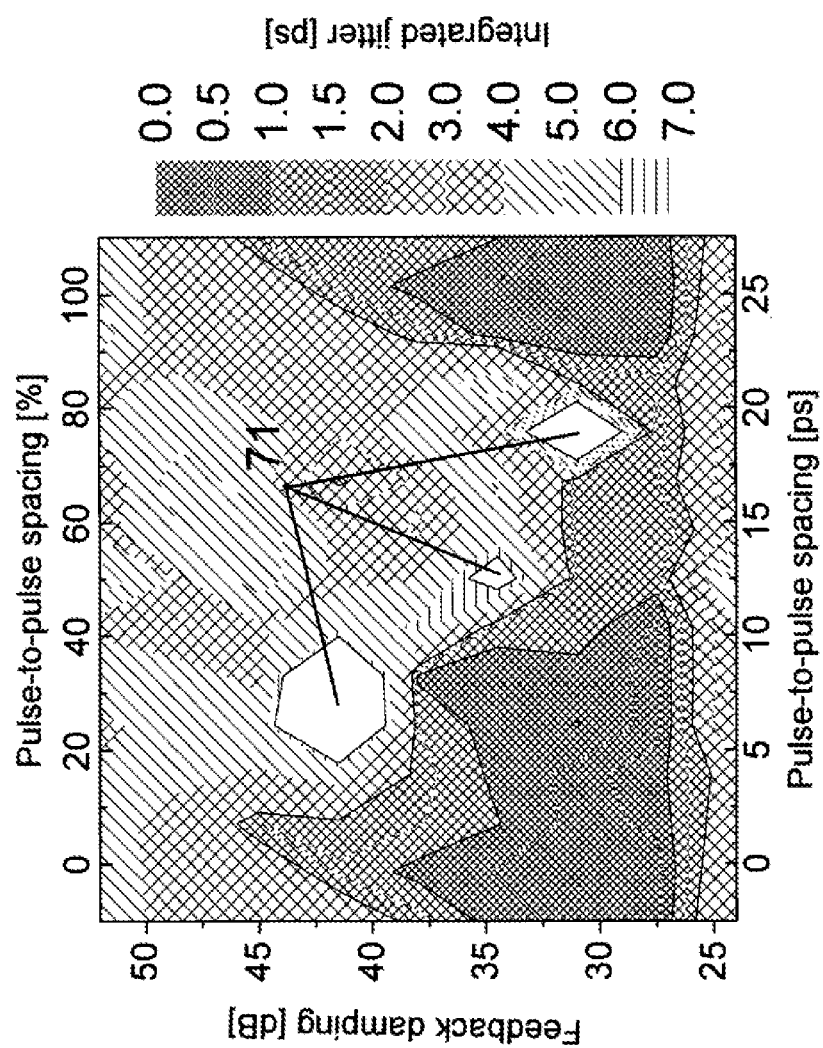
Figure 8:
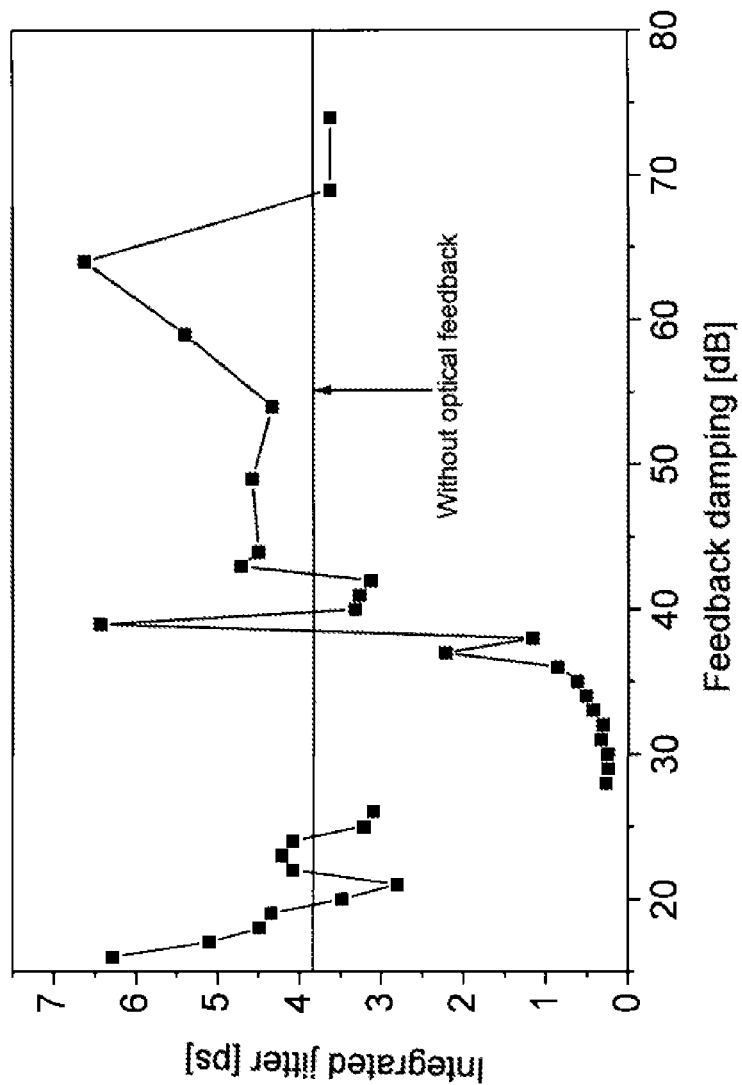
Figure 9:
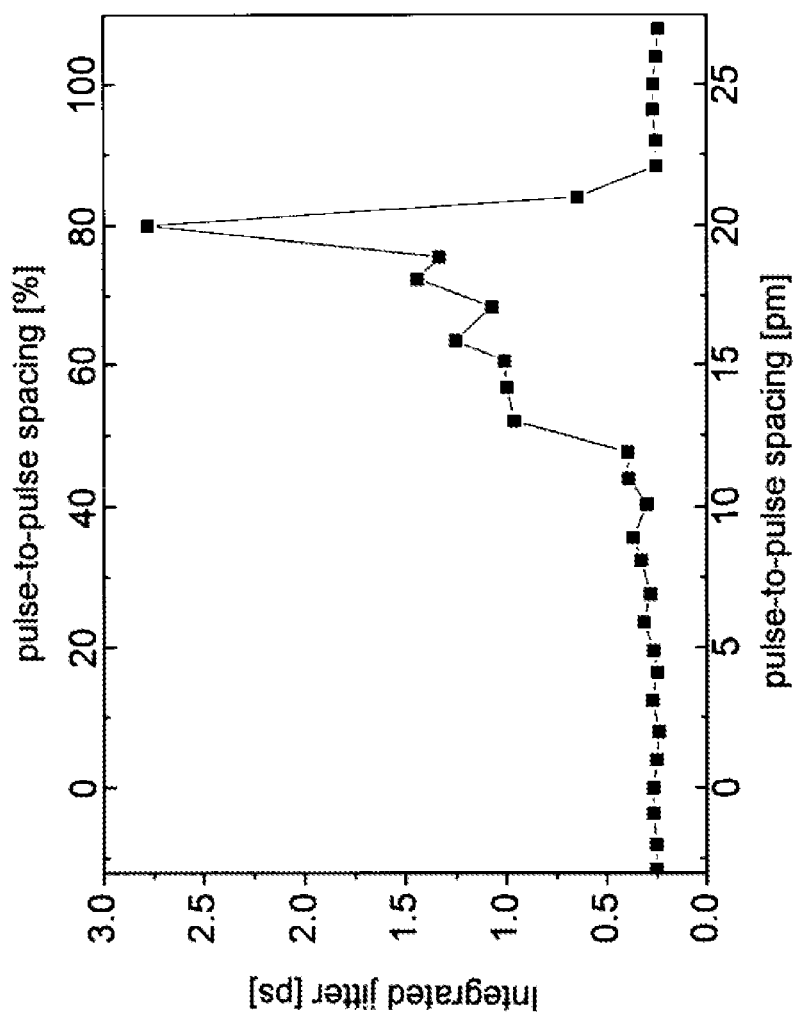
Figure 10:
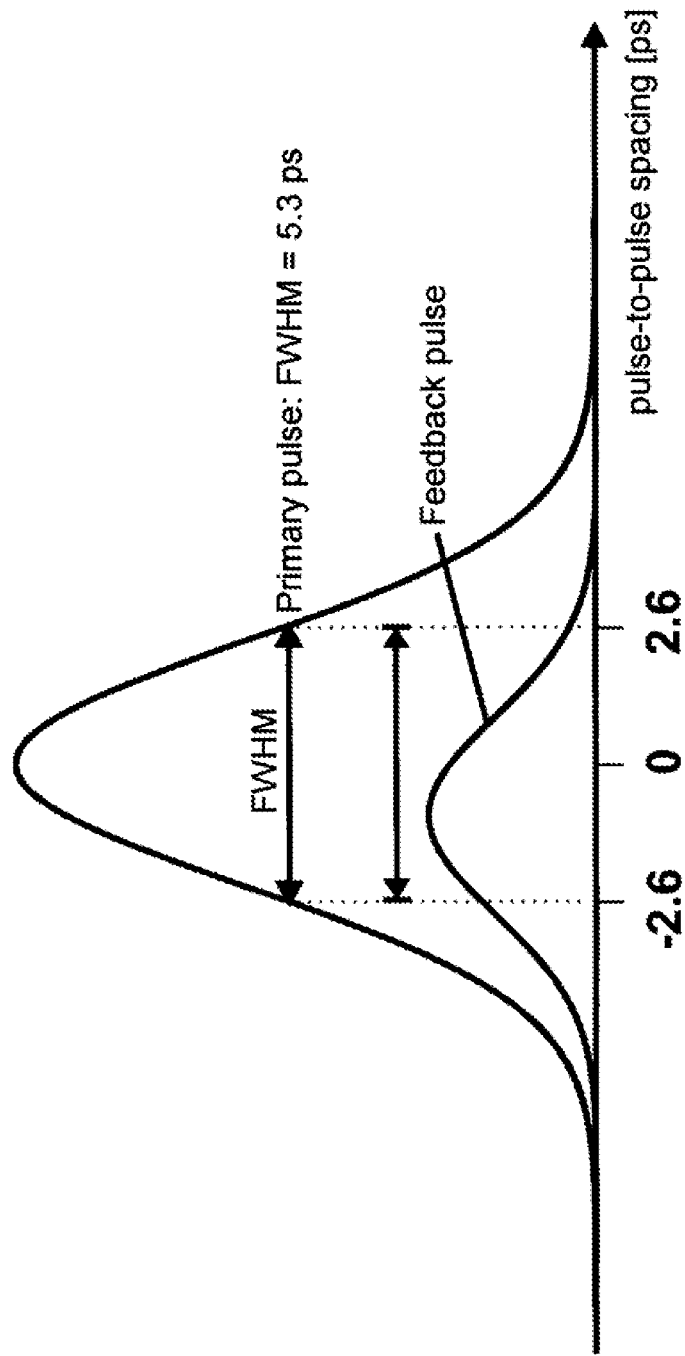

Below, the invention is explained in more detail on the basis of exemplary embodiments; here, in an exemplary manner:

FIG. 1 shows an exemplary embodiment of an optoelectronic oscillator for producing an optical and electrical pulse comb, FIG. 2 shows, in an exemplary manner, the properties of the spectrum of the pulse train emitted by the oscillator in accordance with FIG. 1 with and without optical feedback, and the obtained stabilization of the pulse spacing under optical feedback, FIG. 3 shows the variation of feedback damping and relative delay in the case of a feedback length of 17 m, FIG. 4 shows the properties of the extracted voltage signal and of the optical pulse trains, wherein the portion (a) visualizes the electrical spectrum and the portion (b) visualizes the noise power density, for the case without optical feedback, FIG. 5 shows, for the case with optical feedback, the properties of the spectrum of the electrical signal extracted from the absorber section of the laser of the oscillator in accordance with FIG. 1 (sections (a) and (c)), and the comparison of the noise power densities of the optical signal and of the extracted electrical signal in section (b), FIG. 6 shows the integrated jitter in the case of feedback damping of 35 dB as a function of the feedback length between 17 m and 73 m and the relative delay, FIG. 7 shows the integrated jitter as a function of the feedback damping and the relative delay in the case of a feedback length of 32 m, FIG. 8 shows the integrated jitter as a function of the feedback damping, FIG. 9 shows the integrated jitter in the case of a feedback length of 32 m and a feedback strength of 29 dB as a function of the relative delay, and FIG. 10 shows, in an exemplary manner, the time profile of a feedback pulse and the associated primary pulse in a schematic illustration.

FIG. 1 shows an exemplary embodiment of an optoelectronic oscillator 10 for producing an optical and electrical pulse comb.

The optoelectronic oscillator 10 comprises a monolithically integrated passive mode-locked semiconductor laser 20—which is also abbreviated MLL below. The semiconductor laser 20 comprises a gain section 21, to which a forward voltage $U_v$ is applied, and a (preferably saturatable) absorber section 22, to which a reverse voltage $U_r$ is applied via a bias tee 30.

The optoelectronic oscillator 10 moreover comprises a coupling-in glass fiber 40, a circulator 50, a power divider 60, an isolator 70 and an optical feedback loop 80, which carries a portion of the optical radiation from the semiconductor laser and feeds said portion back into the semiconductor laser 20 as feedback pulses $P_r$. The portion of the optical radiation not fed back is decoupled in the form of optical output pulses $P_a$ at the output A10 of the oscillator or at the output of the isolator 70.

In the exemplary embodiment in accordance with FIG. 1, the voltage modulation can be separated from the applied reverse voltage $U_r$ with the aid of the bias tee 30 due to the photocurrent in the absorber section 22. The radiofrequency signal extracted thus therefore is available as an electrical signal, which consists of comb-like electrical pulses $P_e$, in addition to the optical output pulses $P_a$ of the oscillator 10. The comb-like electrical pulses $P_e$ can be characterized, for example, with the aid of an external electrical spectrum analyzer 100—abbreviated ESA below.

The coupling-in glass fiber 40, which is connected to the gain section facet of the MLL 20 or positioned at the focal distance from the gain section facet of the MLL 20, guides the light of the MLL 20 to a port 51 of the optical circulator 50; the light leaves said circulator 50 via port 52 thereof. By way of example, 90% of the intensity of the light is made available for use in the form of the optical output pulses $P_a$ by the power divider 60, whereas 10% reaches the feedback loop 80.

The feedback loop 80 preferably has a variable attenuator 81 for controlling the strength of the optical feedback (adjustable damping between 2 dB and dB), a variable delay path 82 (adjustable delay, preferably over a period duration of the repetition rate of e.g. 25.9 ps in this case), an additional fiber path 83 with an adjustable length and a polarization actuator 84.

Via the port 53 of the optical circulator 50, the light is incident on the port 51 of the same and, from there, it is coupled back into the MLL 20 via the gain section facet.

Optical Feedback

In a first step, it was shown by the inventor that the optical feedback can lead to a stabilization of the pulse spacing, i.e. a reduction in the phase noise and hence in the time jitter. This is known per se from earlier examinations in respect of optical feedback in MLLs [10].

Since the optical feedback can also lead to an increase in the time jitter in many feedback configurations, the free parameters were now determined exactly for the first time. Exact setting of the feedback length over the optical delay path (with a resolution of 0.1 ps) and of the feedback strength over the variable attenuator (with a resolution of 0.01 dB) are necessary. Only as a result thereof was it possible to set the feedback parameters in such a way that the time jitter is minimal.

For subsequent further measurements, the output pulses $P_a$ emitted by the oscillator 10 were detected with the aid of an external photodiode 110 and converted into a voltage signal $U_e$, which was examined in respect of the frequencies contained therein by means of the ESA 100.

In the ideal case of completely constant pulse spacings and amplitudes, the ESA spectrum would only contain a single frequency. A variation in the pulse spacing leads to a distribution of the frequencies contained in the ESA spectrum and hence to a broadening of the measured line. Accordingly, the line width v is a measure for the stability of the pulse spacing. It is also included in the definition of the pulse-to-pulse jitter $\sigma_{P-P}$ [11]:

$$\sigma_{P-P} = \sqrt{\frac{v}{2\pi f_{MLL}^3}} \qquad (1)$$

Additionally, the noise power density $L_{Noise}$ of the signal at a specific noise frequency $\Delta f$ can be determined with the aid of the ESA. It is calculated from the ratio between the signal power $L_{MLL}$ and the noise power at the corresponding noise frequency $L(\Delta f)$ [12]:

$$L_{Noise}(\Delta f) = \frac{L(\Delta f)}{L_{MLL}} \qquad (2)$$

From this, it is possible to establish the integrated jitter, which is substantially given by the integration over the noise power density. To this end, it is necessary to set the integration limits. Here, the upper integration limit was set to 1 GHz, while the lower one is 10 kHz.

$$\sigma_i^{RMS}(f_u, f_o) = \frac{1}{2\pi f_{carrier}}\sqrt{2\int_{f_u}^{f_o} d(\Delta f) L_{Noise}(\Delta f)}$$

FIG. 2 shows the properties of the ESA spectrum of the pulse train emitted by the MLL, with and without optical feedback, and the obtained stabilization of the pulse spacing under optical feedback; here, section (a) of FIG. 2 shows the noise power density with and without optical feedback, section (b) of FIG. 2 shows a highly resolved measurement of the line in the ESA spectrum without optical feedback and section (c) of FIG. 2 shows a highly resolved measurement of the line in the ESA spectrum with optical feedback.

Under optical feedback at noise frequencies of between 10 kHz and 1 MHz, the noise power density in FIG. 2(a) has been reduced by at least 20 dB (corresponding to less than 1%) (compared to the case without optical feedback). As a result, the level of the thermal noise of the measurement system is reached earlier (1 MHz instead of 20 MHz). Such low noise power densities correspond to a pulse emission with very constant pulse spacing.

This conclusion can also be drawn from observation of the line width. The latter is reduced by 99% from 187.3 kHz without optical feedback to 1.2 kHz under optical feedback. The pulse-to-pulse jitter is reduced from 228 fs to 23 fs.

Accordingly, it is possible to stabilize the pulse spacing in the optical signal extremely efficiently with the aid of the exact control of the parameters of the optical feedback presented here. The space of all feedback configurations resulting from the specified parameters is three-dimensional (strength of the optical feedback, relative delay and fiber length (number of pulses in the feedback loop)). Varying a single feedback parameter already has large effects on the behavior of the system. Initially, measurements were carried out for a constant feedback length of 16.6 m. The relative delay was varied over the whole range of a pulse-to-pulse spacing. This is sufficient because the behavior under optical feedback is periodic in the delay. The damping in the feedback was between 16 dB and 52 dB. As shown in FIG. 3, the variation of the two parameters has an effect on the properties of the electrical spectrum and hence on the integrated jitter.

FIG. 3 shows the variation of feedback damping and relative delay in the case of a feedback length of 16.6 m. FIG. 3 plots five regions in which the optical feedback has a different influence on the pulse emission of the MLL. These regions can be identified on the basis of the ESA and autocorrelation measurements and are classified in more detail below.

Region 1 lies in the region of strong optical feedback in the case of damping up to 20 dB. There, the peak power in the electrical spectrum is approximately 10 dB smaller than in the case without feedback. The lower peak power can be traced back to the fact that the sidebands are very pronounced. The form of the undisturbed ESA spectrum of the MLL can no longer be identified here. What can be noted is that the optical feedback in region 1 influences the MLL so strongly that it dominates the properties of both the electrical and the optical spectrum. Since there is deterioration in the pulse properties and an increase of high noise frequencies in this region, it is not desirable to operate an MLL with optical feedback that is too strong.

The region 2 of the optical feedback is characterized by the transition of the dominant influence of the feedback in region 1 to region 3, which is described below. The transition is chaotic, which is expressed in jumps between the two regions.

Region 3 follows at feedback damping above 25 dB. Here, the Lorentzian form of the peak in the electrical spectrum begins to assert itself. However, the width thereof results in the profile of the noise power density in the region of the fall, by 20 dB per decade, being 12 dB higher than without feedback. In a manner analogous to region 1, the still strong sidebands lead to the noise power density not transitioning into thermal noise. Thus, there also is deterioration in the properties of the pulse emission of the MLL in region 3 of the optical feedback, even if this is not as pronounced.

By contrast, a completely different picture emerges in region 4. This region starts at feedback damping above 30 dB and the extent thereof in the direction of the relative delay is dependent on the feedback strength. What is found is a strong reduction of the line width in the electrical spectrum and a large suppression of the sidebands by at least 49 dB. As a result of the large suppression, only four sidebands are identifiable above the noise level of the measurement system. ESA spectra indicate a very stable pulse emission in this region of the optical feedback. The boundary of the plateau of white noise lies at frequencies of less than 10 kHz. As a result, the reduction by 20 dB per decade already occurs earlier and the limiting thermal noise power density of the measurement system is already reached at 2 MHz. As a result of the stabilization of the pulse spacing with an unchanging pulse quality, it is desirable to work in this region when using optical feedback. In the case of feedback in this region, the primary pulses always automatically shift onto the feedback pulses, to be precise for all delays between approximately 15 and 65%; i.e., $\Delta T$ between primary and feedback pulses is always zero. Thus, the pulses are clamped to one another. In this region, the production of the primary pulses is shifted in time by the feedback pulses in such a way that these coincide after the equilibrium is set. Therefore, at a time just before the primary pulse emission without feedback (vertical arrow), very weak feedback strengths are also sufficient to obtain resonant lasing. If the feedback pulses are shifted away from this time (in the direction of 50, 60%), this no longer works at low powers.

Finally, region 5 of the optical feedback is situated outside of region 4 and above feedback damping of 30 dB to 35 dB. In region 5, the optical spectrum is the same as in the case without feedback and the electrical spectrum already shows a known Lorentzian form. However, the width of the Lorentzian profile increases as a function of the feedback parameters in this region without a discernible pattern. Accordingly, the influence of the optical feedback is not strong enough there to stabilize the pulse emission like in region 4. Rather, there can be disturbances of the pulse emission.

Extraction of an Electrical Signal

As explained above, the pulses circulating in the cavity of an MLL lead to modulation of the photocurrent and this in turn leads to modulation of the voltage applied to the absorber section. In the design in accordance with FIG. 1, this voltage modulation is accessible and can be used technically.

FIG. 4 shows a comparison of the properties of the extracted voltage signal and of the optical pulse trains, wherein the section (a) visualizes the ESA spectrum and section (b) visualizes the noise power density. As emerges from FIG. 4, the properties of the electrical spectrum are virtually independent of whether the optical signal or the extracted electrical signal is observed.

What this shows is that the charge carrier dynamics in the absorber section are able to follow the modulation of the electron hole pair production by the pulse circulation. These circumstances form the basis for the production of stable electrical signals with the aid of the oscillator in accordance with FIG. 1.

Combined Production of Stable Electrical and Optical Signals:

As shown above, the noise properties of the optical pulse train are transferred directly to the voltage signal at the absorber section. The oscillator shown in FIG. 1 links the stabilization of the pulse distance in the optical signal accompanying the optical feedback with the production of a frequency-stable electrical signal:

1. The optical feedback reduces the variations in the pulse spacing in the MLL cavity.
2. This leads to reduction in the pulse-to-pulse jitter by 90% in the emitted optical pulse train compared to the case without optical feedback.
3. The pulse circulating in the cavity leads to a modulation of the photocurrent in the absorber section.

4. The modulation of the photocurrent leads to a modulation of the voltage dropping across the absorber section of the laser diode.
5. The noise properties of the signal produced by this modulation largely correspond to those of the optical signal. As a result, the phase noise of the electrical signal is also suppressed by the optical feedback.

The basic functionality could be reproduced using the oscillator shown in FIG. 1.

FIG. 5 shows the properties of the ESA spectrum of the electrical signal extracted from the absorber section of the MLL; here, section (a) shows an ESA spectrum of the electrical signal in a broad frequency interval, section (b) shows the noise power density of the extracted electrical signal and of the optical signal and section (c) shows a highly resolved measurement of the central line in the ESA spectrum of the electrical signal.

The signal-to-noise ratio in the electrical spectrum is 67 dB and the distance of the sidebands visible in the ESA spectrum from the central line corresponds to the natural frequency of the feedback loop. As can be shown, these sidebands correspond to a small amplitude modulation (approximately 1% to 2% of the pulse amplitude) and do not restrict the usability of the electrical signal. The width of the central line is only 3.25 kHz and the pulse-to-pulse jitter of this electrical signal emerges as 30 fs. The repetition rate of the electrical signal corresponds to that of the optical signal.

A comparison of the noise power densities of the electrical and the optical signal shows that the component presented here is able to simultaneously produce optical pulse trains and a high quality electrical signal with a very low phase noise.

The decisive advantages of the presented component compared to hybrid mode locking are:
An optical and an electrical radiofrequency signal of the highest quality are produced simultaneously.
No external radiofrequency voltage signal is required. This results in advantages in terms of size and cost.

The decisive advantages of the oscillator 10 in accordance with FIG. 1 compared to current optoelectronic oscillators are:
The repetition rate can range from a few GHz up to at least 100 GHz. The only decisive variable in this case is the cavity length of the MLL.
Only passive optical and electrical components are required. Therefore, the repetition rate of the system is not limited by the bandwidth of active electronic components.
The passive optical and electrical components lead to low energy consumption and low production costs.

The steps by means of which the ideal parameter range for the oscillator in accordance with FIG. 1 can be determined are to be explained again, using different words, in conjunction with the FIGS. 6 to 10:
The three decisive parameters of the optical feedback are
the feedback damping,
the relative delay and
the length of the feedback loop.
These variables span a three-dimensional parameter space and are linked to one another.

First of all, the influence of the fiber length is discussed below. In order to eliminate the influence of the greater damping in the case of longer fiber paths, the attenuation was respectively set in such a way that the overall damping in the feedback loop is constantly 35 dB.

Length Dependence

FIG. 6 shows the integrated jitter in the case of feedback damping of 35 dB as a function of the feedback length between 17 m and 73 m and the relative delay. The relative delay was varied over a time range of 32.5 ps, and therefore over a time range that is greater than the period of 25.9 ps. The integrated jitter varies over nearly 2 powers of ten. The chaotic region, in which no stable mode locking occurs, is white and denoted by the reference sign 61. The areas 62 and 63 with minimal integrated jitter correspond to the region of resonant feedback. The latter has its greatest extent in the case of a fiber length of 32 m+/−2 m.

Dependence on Feedback Damping and Relative Delay

Now, the effect on the behavior of the system was determined for a constant feedback length of 32 m by varying the relative delay and the feedback damping. The relative delay was varied over a range of 30 over ps. This is more than sufficient as the behavior under optical feedback is periodic in the delay and the period corresponds to the temporal spacing of the pulses of the MLL (25.9 ps in this case). The damping in the feedback loop varied between 16 dB and 52 dB. The variation of the two parameters in turn has a huge effect on the integrated jitter.

FIG. 7 shows the integrated jitter as a function of the feedback damping and the relative delay in the case of a feedback length of 32 m. The white areas 71 correspond to jitter over 7 ps.

FIG. 8 shows the integrated jitter as a function of the feedback damping. It is possible to see that the ideal feedback damping lies at 29.5 dB+/−2.5 dB. The integrated jitter once again varies over nearly 2 powers of ten Dependence on Relative Delay After setting the ideal feedback damping to a constant value of this parameter of 29 dB, the region of the ideal relative delay is now determined. There is a strong reduction in the noise from −3 ps to 12 ps, corresponding to an integrated jitter up to 390 fs and hence to a reduction by more than a factor of 10 in relation to the case without feedback.

FIG. 9 shows the integrated jitter at a feedback length of 32.7 m and a feedback strength of 29 dB as a function of the relative delay.

However, for resonant feedback, which brings about a reduction in the jitter by a factor of 15 and more, the feedback pulses must, in relation to the primary pulses, be incident within the optical full width at half maximum of the primary pulses. The full width at half maximum thereof is 5.3 ps in this case. This is shown in an exemplary manner in FIG. 10.

In the case of feedback in this range, the primary pulses then always automatically shift to the feedback pulses (clamping effect); to be precise for all relative delays lying within the full width at half maximum of the primary pulses. Consequently, ΔT is actually always zero and the pulses are clamped to one another.

CITATIONS

[1] L. Maleki, "The optoelectronic oscillator", *Nature Photonics—Industry Perspective*, pp. 728-730, December 2011.
[2] S. K. Tewksbury and L. A. Hornak, "Optical Clock Distribution in Electronic Systems", *Journal of VLSI Signal Processing*, pp. 225-246, 1997.
[3] P. J. Delfyett, D. H. Hartmann and S. Z. Ahmad, "Optical Clock Distribution Using a Mode-Locked Semiconductor Laser Diode System", *Journal of Lightwave Technology*, pp. 1646-1649, December 1991.

[4] H. A. Haus, "Mode-locking of lasers", *IEEE Journal of Selected Topics in Quantum Electronics*, vol. 6, no. 6, pp. 1173-1185, November 2000.

[5] D. Bimberg, "Quantum dot based nanophotonics and nanoelectronics", *Electronics Letters*, vol. 44, no. 3, pp. 168-171, January 2008.

[6] M. Kuntz, G. Fiol, M. Lämmlin, C. Meuer and D. Bimberg, "High-Speed Mode-Locked Quantum-Dot Lasers and Optical Amplifiers", *Proceedings of the IEEE*, vol. 95, no. 9, pp. 1767-1778, September 2007.

[7] J. Lasri, A. Bilenca, D. Dahan, V. Sidorov, G. Eisenstein, D. Ritter and K. Yvind, "A Self-Starting Hybrid Optoelectronic Oscillator Generating Ultra Low Jitter 10-GHz Optical Pulses and Low Phase Noise Electrical Signals", *IEEE Photonics Technology Letters*, pp. 1004-1006, July 2002.

[8] C. W. Nelson, A. Hati, D. A. Howe and W. Zhou, "Microwave Optoelectronic Oscillator with Optical Gain", *National Institute of Standards and Technology (NIST)*, 2007.

[9] N. Yu, E. Salik and L. Maleki, "Ultralow-noise mode-locked laser with coupled optoelectronic oscillator configuration", *Optics Letters*, pp. 1231-1233, May 2005.

[10] G. Fiol, M. Kleinert, D. Arsenijevic and D. Bimberg, "1.3 μm range 40 GHz quantum-dot mode-locked laser under external continuous wave light injection or optical feedback", *Semiconductor Science and Technology*, vol. 26, no. 1, p. 014006, November 2010.

[11] F. Kéfélian, S. O'Donoghue, M. T. Todaro, J. G. McInerney and G. Huyet, "RF Linewidth in Monolithic Passively Mode-Locked Semiconductor Laser", *IEEE Photonics Technology Letters*, vol. 20, no. 16, pp. 1405-1407, Aug. 15, 2008.

[12] D. von der Linde, "Characterization of the Noise in Continuously Operating Mode-Locked Lasers", *Applied Physics B*, vol. 39, pp. 201-207, 1986.

[13] G. Fiol, "1.3 μm Monolithic Mode-Locked Quantum-Dot Semiconductor Lasers", Berlin: Mensch and Buch Verlag, 2011.

[14] OEWaves Inc., "Micro-Opto-Electronic Oscillator (uOEO)", Pasadena, USA, 2012.

LIST OF REFERENCE SIGNS

10 Optoelectronic oscillator
20 Semiconductor laser
21 Gain section
22 Saturable absorber section
30 Bias tee
40 Coupling-in glass fiber
50 Circulator
51 Port of the optical circulator
52 Port of the optical circulator
53 Port of the optical circulator
60 Power splitter
70 Isolator
80 Optical feedback loop
81 Variable attenuator
82 Variable delay path
83 Fiber path
84 Polarization actuator
100 External spectrum analyzer
110 Photodiode
A10 Output of the oscillator
Pa Output pulse
Pe Comb-like electrical pulse
Pr Feedback pulse
Ue Voltage signal
Uv Forward voltage
Ur Reverse voltage

The invention claimed is:

1. An optoelectronic oscillator (10) for producing an optical and/or electrical pulse comb,
comprising a monolithically integrated passive mode-locked semiconductor laser (20) and
comprising an optical feedback loop (80) which guides part of an optical radiation from the semiconductor laser (20) and couples said radiation back into the semiconductor laser (20) as feedback pulses (Pr), wherein
the semiconductor laser (20) would emit comb-like optical pulses—referred to as primary pulses below—without influence by the feedback pulses (Pr) and emits influenced, comb-like output pulses (Pa) in the case of influence by the feedback pulses (Pr), which output pulses have a smaller temporal jitter or a smaller phase noise than the primary pulses,
a damping of the feedback loop (80) is between 27.5 and 37.5 dB,
a time lag of the feedback loop (80) is selected in such a way that each feedback pulse (Pr) is incident within a temporal full width at half maximum of the respective next primary pulse, i.e. of that next pulse which the semiconductor laser (20) would have produced without influence by the incident feedback pulse (Pr), and
a length of the feedback loop (80) lies between 30 m and 34 m.

2. The optoelectronic oscillator (10) as claimed in claim 1, wherein the time lag of the feedback loop (80) is selected in such a way that a pulse peak power of each feedback pulse (Pr) is incident within the temporal full width at half maximum of the respective next primary pulse.

3. The optoelectronic oscillator (10) as claimed in claim 1, wherein a bias tee (30) is electrically connected to the monolithically integrated passive mode-locked semiconductor laser (20), by means of which electrical pulses which, in terms of their frequency, correspond to the optical output pulses (Pa) of the semiconductor laser (20) influenced by the feedback pulses (Pr), are decoupled.

4. The optoelectronic oscillator (10) as claimed in claim 3, wherein
the semiconductor laser (20) comprises a gain section (21), to which a forward voltage (Uv) can be applied, and a saturable absorber section (22), to which a reverse voltage (Ur) can be applied, and
the bias tee (30) is electrically connected to the absorber section (22).

5. The optoelectronic oscillator (10) as claimed in claim 4, wherein
a modulated photocurrent from the absorber section (22) is applied to the bias tee (30).

6. The optoelectronic oscillator (10) as claimed in claim 4, wherein
one connection of the bias tee (30) forms an electrical output for outputting electrical pulses, a pulse profile of which corresponds to, or is identical to, a pulse profile of the output pulses (Pa) influenced by the feedback pulses (Pr) of the feedback loop (80).

7. The optoelectronic oscillator (10) as claimed in claim 1, wherein
an active region of the semiconductor laser (20) has a double heterostructure or a fivefold structure with separated localization of charge carriers and photons, with quantum wells, quantum wires and/or quantum dots.

8. A method for generating an optical and/or electrical pulse comb by means of an optoelectronic oscillator (10) comprising a monolithically integrated mode-locked semiconductor laser (20) and an optical feedback loop (80) which reflects part of an optical radiation from the semiconductor laser (20) and couples said radiation back into the semiconductor laser (20) as feedback pulses (Pr), wherein the semiconductor laser (20) would emit comb-like optical pulses—referred to as primary pulses below—without influence by the feedback pulses (Pr) and emits influenced, comb-like pulses in the case of influence by the feedback pulses (Pr), from the feedback loop (80), wherein
- a damping of the feedback loop (80) is set to a value between 27.5 and 37.5 dB,
- a time lag of the feedback loop (80) is set in such a way that each feedback pulse (Pr) is incident within a temporal full width at half maximum of the respective next primary pulse, i.e. of that next pulse which the semiconductor laser (20) would have produced without influence by the incident feedback pulse (Pr), and
- a length of the feedback loop (80) lies between 30 m and 34 m.

9. The optoelectronic oscillator (10) as claimed in claim 5, wherein
- one connection of the bias tee (30) forms an electrical output for outputting electrical pulses, a pulse profile of which corresponds to, or is identical to, a pulse profile of the output pulses (Pa) influenced by the feedback pulses (Pr) of the feedback loop (80).

10. The optoelectronic oscillator (10) as claimed in claim 1, wherein the length of the feedback loop (80) is selected in such a way that 6000 to 7000 optical pulses circulate therein.

* * * * *